United States Patent
Fan

(10) Patent No.: US 10,806,038 B1
(45) Date of Patent: Oct. 13, 2020

(54) ELECTRONIC DEVICE

(71) Applicant: BEIJING XIAOMI MOBILE SOFTWARE CO., LTD., Beijing (CN)

(72) Inventor: Jie Fan, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 0 days.

(21) Appl. No.: 16/698,282

(22) Filed: Nov. 27, 2019

(30) Foreign Application Priority Data

Jun. 24, 2019 (CN) .......................... 2019 1 0549393

(51) Int. Cl.
*H05K 1/02* (2006.01)
*H05K 3/46* (2006.01)
*H05K 3/20* (2006.01)

(52) U.S. Cl.
CPC ........... *H05K 3/4691* (2013.01); *H05K 3/207* (2013.01)

(58) Field of Classification Search
CPC ........ H05K 1/028; H05K 1/111; H05K 1/117; H05K 1/118; H05K 1/147; H05K 1/148; H05K 1/189; H05K 3/361; H05K 3/4691
See application file for complete search history.

(56) References Cited

U.S. PATENT DOCUMENTS

2006/0062526 A1* 3/2006 Ikeuchi ................ G02B 6/4201
385/88
2009/0289885 A1* 11/2009 Chao ...................... H05K 1/147
345/98

* cited by examiner

*Primary Examiner* — Ho C Nguyen
(74) *Attorney, Agent, or Firm* — Oblon, McClelland, Maier & Neustadt, L.L.P.

(57) ABSTRACT

The present disclosure relates to an electronic device. The electronic device can include a device body, a control main board, and at least one function module mounted in the device body. The control main board of the electronic device is provided with a pad group and a flexible printed circuit board, such that each pad group is electrically connected to the corresponding function module by the flexible printed circuit board. The first connecting terminal of the flexible printed circuit board is electrically connected to the function module, and the pins of the second connecting terminal of the flexible printed circuit board correspond to and electrically cooperate with the pads of the pad group.

9 Claims, 2 Drawing Sheets

ELECTRONIC DEVICE

CROSS-REFERENCE TO RELATED APPLICATIONS

This application is based upon and claims priority to Chinese Patent Application 2019105493934, filed on Jun. 24, 2019, the entire contents of which are incorporated herein by reference.

TECHNICAL FIELD

The present disclosure generally relates to a field of electronic technologies, and more particularly to an electronic device.

BACKGROUND

Electronic devices, such as a mobile phone, generally include function modules, such as a power module, a camera module, a sensor module, and the like. These function modules can be coupled with a main board by electrical connectors provided on the main board of the device to implement the corresponding functions. However, the plurality of electrical connectors occupy too much space on the main board due to their large structural sizes. This can result in extending structures of the main board and affects the light-thin performance of a device body and implementation of the functions of other modules in the device body. For example, a thickness of the main body can be increased while the capacity of the power module is reduced.

SUMMARY

The present disclosure provides an electronic device for optimizing a utility of space on a control main board, enhancing effects of function modules, and improving thin-light performance of the electronic device.

Embodiments according to the present disclosure provide an electronic device that can include a device body, a control main board, and at least one function module mounted in the device body. The control main board can include a base plate, a flexible printed circuit board, and at least one pad group provided on the base plate. Each pad group can be electrically connected to a corresponding function module by the flexible printed circuit board. The flexible printed circuit board can include a first connecting terminal electrically connected to the at least one function module and a second connecting terminal including a plurality of pins. The pad group can further include a plurality of pads corresponding to and electrically cooperating with the pins.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise specified. The implementations set forth in the following description of exemplary embodiments do not represent all implementations consistent with the present disclosure. Instead, they are merely examples of apparatuses and methods consistent with aspects related to the present disclosure as recited in the appended claims.

Electronic devices, such as a mobile phone, can generally include function modules, such as a power module, a camera module, a sensor module, and the like. The above function modules are coupled with a main board of the device by electrical connectors provided on the main board to implement corresponding functions. However, the plurality of electrical connectors occupy too much space on the main board due to their large structural sizes, which results in extending structures of the main board and affects light-thin performance of a device body and implementation of the functions of other modules in the device body. For example, the main body can be thickened and the capacity of the power module can be reduced.

Figure 1:
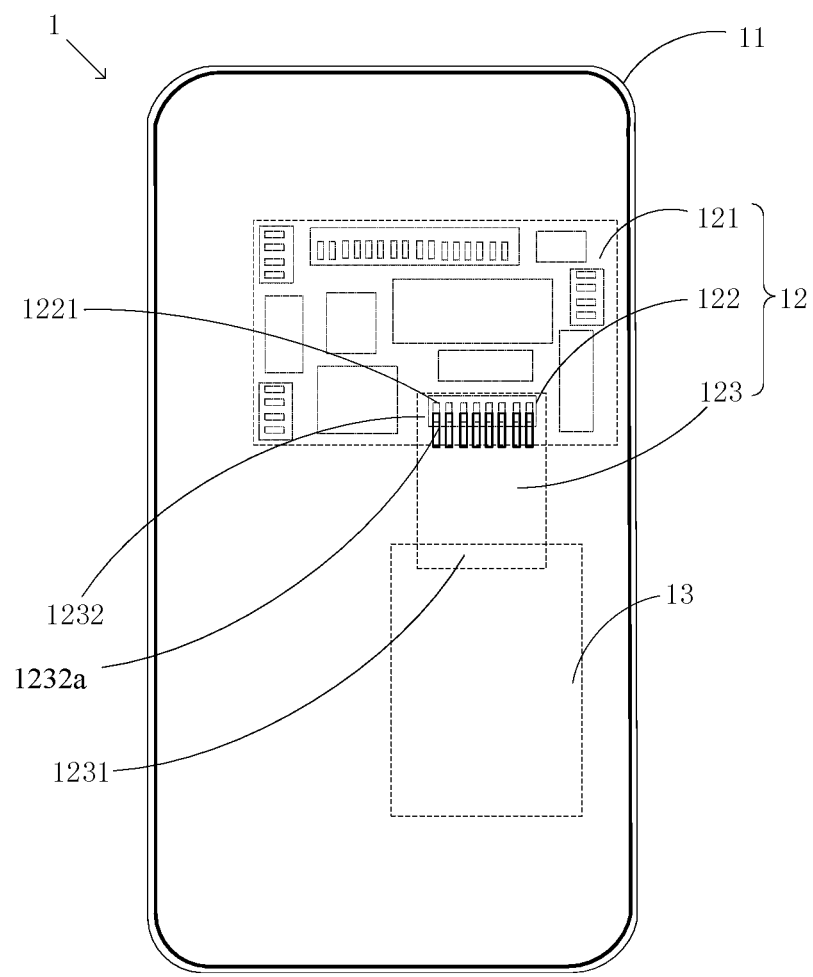
FIG. 1 is a perspective view of an electronic device of an exemplary embodiment of the present disclosure.

FIG. 1 is a schematic view of an electronic device of an exemplary embodiment of the present disclosure. As illustrated in FIG. 1, an electronic device 1 can include a device body 11, and a control main board 12, and at least one function module 13 which are mounted in the device body 11. The control main board 12 includes a base plate 121, a pad group 122, and a flexible printed circuit board 123. The pad group 122 is provided on the base plate 121, and each pad group 122 electrically connected to a corresponding function module 13 by a flexible printed circuit board 123. The flexible printed circuit board 123 includes a first connecting terminal 1231 and a second connecting terminal 1232. The first connecting terminal 1231 is electrically connected to the at least one function module 13. The second connecting terminal 1232 includes a plurality of pins 1232a, and the pad group 122 includes a plurality of pads 1221, the pads 1221 correspond to and electrically cooperate with the pins 1232a.

The control main board 12 of the electronic device 1 is provided with the pad group 122 and the flexible printed circuit board 123, such that each pad group 122 is electrically connected to the corresponding function module 13 by the flexible printed circuit board 123. The first connecting terminal 1231 of the flexible printed circuit board 123 is electrically connected to the function module 13, and the pins 1232a of the second connecting terminal 1232 of the flexible printed circuit board 123 correspond to and electrically cooperate with the pads 1221 of the pad group 122. Since the pads 1221 can be flexibly arranged on the base plate 121 of the control main board 12, and electrical cooperation between the pins 1232a of the second connecting terminal 1232 of the flexible printed circuit board 123 and the pads 1221 occupies little space, the utility rate of space on the control main board 12 can be optimized, and the light-thin performance of the electronic device 1 can be improved. When the space on the control main board 12 is optimized, the size of control main board 12 is reduced, thereby increasing mounting space and functional effects of the function module 13.

It should be noted that, the pins 1232a of the second connecting terminal 1232 can be connected to the pads 1221 by laser welding. The flexible printed circuit board 123 can be electrically connected to the control main board 12 by laser welding, an area needed by cooperation between the flexible printed circuit board 123 and the control main board 12 is reduced, and the connection is stable, thereby helping to optimize the utility rate of space on the control main board 12.

In the above embodiments, various electronic components 124, such as a central processing unit (CPU), a power management unit (PMU), a low dropout regulator (LDO), a resistance, a capacitor, a filter, and the like are integrated on the base plate 121 of the control main board 12. Installation of the above circuits and the electronic components 124 occupies most space of the base plate 121. Therefore, at least one preset area can be provided at a vacant space on the base plate 121 in order to avoid influence on structures and functions of the electronic components 124 caused by the pads 1221, and the pads 1221 are arranged in the preset area.

As shown, one pad group 122 corresponds to and is connected to one function module 13, such that the control main board 12 controls the function module 13. The electronic device 1 can include one or more function modules 13 to implement corresponding functions. When the electronic device 1 includes a plurality of the function modules 13, a plurality of pad groups 122 can be arranged on the control main board 12 correspondingly, such that the control main board 12 controls the function modules 13 by corresponding cooperation between the pad groups and the function modules. The cooperation between one function module 13 and the corresponding pad group 122 is exemplarily described as follows.

In an embodiment, as illustrated in FIG. 1, a plurality of pads 1221 of any one pad group 122 are concentrated and arranged at the same preset area on the base plate 121. In other words, the pads 1221 of the pad group 122 corresponding to one function module 13 are provided in the same preset area, thereby easily distinguishing the pads 1221 and controlling the function module 13. The flexible printed circuit board 12 can include one second connecting terminal 1232, and the first connecting terminal 1231 of the flexible printed circuit board 123 is electrically connected to the corresponding function module 13. Pins 1232a of the second connecting terminal 1232 electrically cooperate with the pads 1221 in the preset area. The pads 1221 in the same preset area cooperate with the pins 1232a of one second connecting terminal 1232, which reduces complex of connecting process, improves convenience of connection and structural regularity of the control main board 12.

Figure 2:
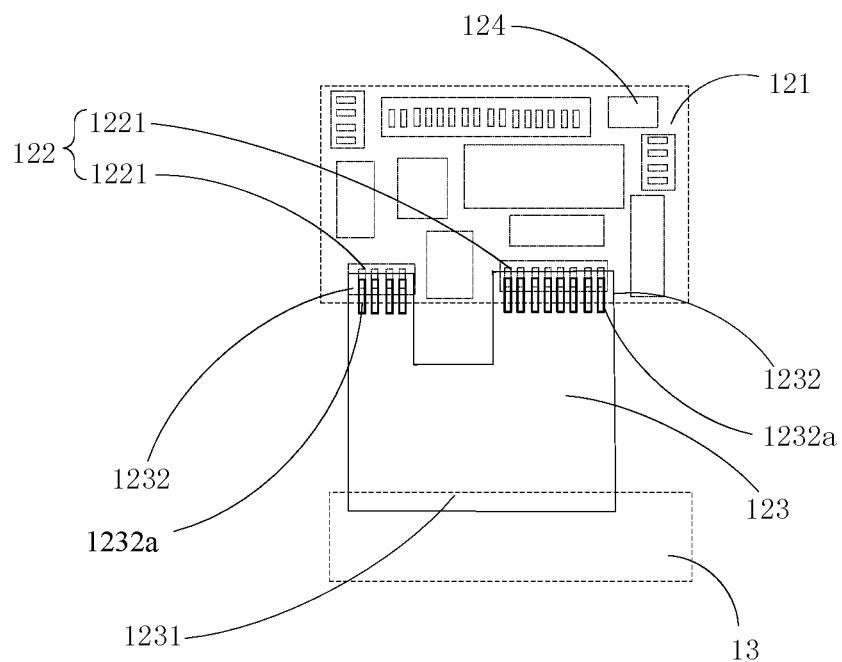
FIG. 2 is a schematic view illustrating cooperation between function modules and a control main board of an exemplary embodiment of the present disclosure.

In another embodiment, as illustrated in FIG. 2, at least two pads 1221 of any one pad group 122 can be arranged in different preset areas on the base plate 121. In other words, the pads 1221 of the pad group 122 corresponding to one function module 13 are provided in different preset areas, and the preset areas can be scattered areas on the base plate 121, thereby increasing the utility rate of space on the control main board 12. The flexible printed circuit board 123 can include a plurality of second connecting terminals 1232, the plurality of second connecting terminals 1232 is achieved by using a bifurcated structure at one end of the flexible printed circuit board 123. With the bifurcated structure and bendable property of the flexible printed circuit board 123, the flexibility of cooperation between the flexible printed circuit board 123 and the control main board 12 is improved.

At this time, the first connecting terminal 1231 of the flexible printed circuit board 123 is electrically connected to the corresponding function module 13, and the plurality of second connecting terminals 1232 cooperate with different preset areas respectively, such that the pins 1232a of each of the second connecting terminals 1232 electrically cooperate with the pads 1221 in the corresponding preset area.

For example, the pad group 122 corresponding to a certain function assembly includes twenty pads 1221, the twenty pads 1221 can be divided into three groups with two groups each containing five pads 1221 and one group containing ten pads 1221. The three groups are arranged in different preset areas, and then cooperate with three second connecting terminals 1232 of the flexible printed circuit board 123 respectively. Since five pads 1221 or ten pads 1221 have no high requirement for space on the control main board 12, the utility rate of space on the control main board 12 can be easily raised.

In the above embodiment, the pads 1221 in any one preset area are arranged in an array of a single row or a plurality of rows, which can be set according to the number of the pins 1232a on the second connecting terminal 1232 of the flexible printed circuit board 123 corresponding to the pads 1221 in the pad group 122. For example, when number of the pins 1232a on the second connecting terminal 1232 of the flexible printed circuit board 123 is less than 40, as illustrated in FIG. 2, the pads 1221 in the corresponding preset area can be arranged in a single row, thereby reducing space occupied by the pads 1221 and facilitating electrical cooperation between the second connecting terminal 1232 and the pads 1221.

Figure 3:
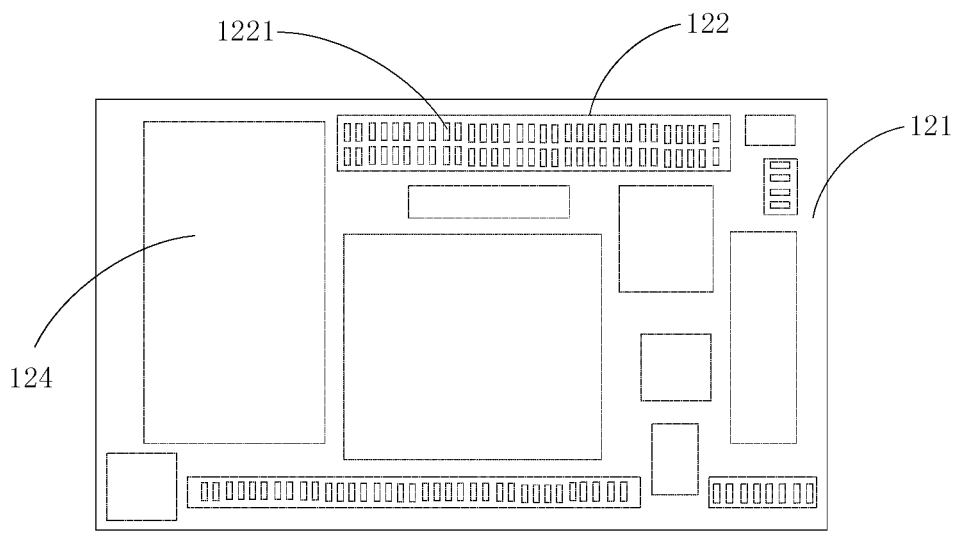
FIG. 3 is schematic view of a control main board of an exemplary embodiment of the present disclosure.

For another example, when the number of the pins 1232a on the second connecting terminal 1232 of the flexible printed circuit board 123 is larger than 40, as illustrated in the pad group 122 at an upper portion in FIG. 3, the pads 1221 in the corresponding preset area can be arranged in two rows or a plurality of rows, thereby reducing difficulty in welding the flexible printed circuit board 123 to the control main board 12, and improving matching between the pad group 122 and a shape of a preset space. For example, when the preset space is rectangular, the plurality of pads 1221 can be designed to have a single-row structure, while when the preset space is square, the plurality of pads 1221 can be designed to have a two-row structure.

Furthermore, compared with a scheme in the related art that an electronic connector is provided on the control main board 12 so as to achieve connection between the control main board 12 and the function module 13 through the electronic connector, the scheme of cooperation between the pads 1221 and the flexible printed circuit board 123 in the present disclosure also can save space of the base plate 121 occupied by fixing columns of the electronic connector. Meanwhile, on the premise that the process of connection between the pads 1221 and the flexible printed circuit board 123 is guaranteed, a distance between adjacent two rows of pads 1221 can be further reduced, thereby reducing the area of the control main board 12 occupied by the pads. For example, the pad group 122 contains fifty pads 1221, and the fifty pads 1221 are arranged in two rows, such that at least 1.0 mm can be saved in the width and at least 1.5 mm can be saved in the length. If the above saved space is used for raising the size of the power module, the power capacity (converted) can be raised by about 120 mAh.

The preset area is provided at an edge area of the base plate 121, so as to reduce space of the base plate 121 occupied by the preset area, provide more space for mounting the other electronic components 124 on the control main board 12, and make it convenient to connect the flexible printed circuit board 123 to the pads 1221. Alternatively, when a plurality of electronic components 124 are mounted on the base plate 121 of the control main board 12, the preset area can be arranged on the base plate 121 between adjacent electronic components 124, in order to raise the utility rate of scattered space on the base plate 121.

In addition, the electronic device 1 can include one or more flexible printed circuit boards 123, which is not limited herein. When the electronic device 1 includes one flexible printed circuit board 123, the flexible printed circuit board 123 can be provided with a plurality of first connecting terminals 1231, such that the first connecting terminals 1231 are electrically connected to function modules 13 at different positions, excessive influence on structures in the device body 11 caused by the flexible printed circuit board 123 can be avoided, and the regularity in the device body 11 can be improved. Alternatively, when the electronic device 1 includes a plurality of flexible printed circuit boards 123, the flexible printed circuit boards 123 correspond to and cooperate with the function modules 13 one to one, thereby facilitate connection operation and following maintenance.

It should be noted that, the function module 13 can be one or more of a power module, a camera module, a fingerprint module, a display module, a sensor module, a voice module, and the like, which is not limited herein. For example, when the function module 13 includes the power module, a saved space achieved by means of cooperation between the flexible printed circuit board 123 and the pads 1221 is used for raising a size of the power module, which can raise the power capacity of the power module and therefore prolonging the duration of the electronic device 1.

The electronic device 1 can be a mobile phone, an on-vehicle terminal, a tablet computer, a medical terminal, and the like, which is not limited herein. The control main board 12 of the electronic device 1 is provided with the pad group 122 and the flexible printed circuit board 123, such that each pad group 122 is electrically connected to the corresponding function module 13 by use of the flexible printed circuit board 123. The first connecting terminal 1231 of the flexible printed circuit board 123 is electrically connected to the function module 13, and the pins 1232a of the second connecting terminal 1232 of the flexible printed circuit board 123 correspond to and electrically cooperate with the pads 1221 of the pad group 122. Since the pads 1221 can be flexibly arranged on the base plate 121 of the control main board 12, and electrical cooperation between the pins 1232a of the second connecting terminal 1232 of the flexible printed circuit board 123 and the pads 1221 occupies little space, the utility rate of space on the control main board 12 can be optimized, and the light-thin performance of the electronic device 1 can be improved. When the space on the control main board 12 is optimized, the size of control main board 12 is reduced, thereby increasing mounting space and functional effect of the function module 13.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. An electronic device, comprising:
   a device body; and
   a control main board and at least one function module mounted in the device body;
   the control main board including:
      a base plate including at least one preset area,
      a plurality of electronic components mounted on the base plate, the at least one preset area being arranged on the base plate between adjacent electronic components,
      a flexible printed circuit board having a first connecting terminal electrically connected to the at least one function module and a second connecting terminal having a plurality of pins, and
      at least one pad group provided on the base plate, and each pad group being electrically connected to a corresponding function module by the flexible printed circuit board, the pad group having a plurality of pads corresponding to and electrically cooperating with the pins of the second connecting terminal, wherein the pads are provided in the at least one preset area.

2. The electronic device of claim 1, wherein the pads of any one pad group are concentrated and arranged at a same preset area on the base plate, the flexible printed circuit board further includes one second connecting terminal, and the pins of the second connecting terminal electrically cooperate with the pads in the preset area.

3. The electronic device of claim 1, wherein at least two pads of any one pad group are arranged in different preset areas on the base plate, the flexible printed circuit board further includes a plurality of second connecting terminal corresponding to different preset areas respectively, such that the pins of each of the second connecting terminals electrically cooperates with the pads in the corresponding preset area.

4. The electronic device of claim 1, wherein the pads in any one preset area are arranged in an array of a single row.

5. The electronic device of claim 1, wherein the pads in any one preset area are arranged in an array of a plurality of rows.

6. The electronic device of claim 1, wherein the preset area is provided at an edge area of the base plate.

7. The electronic device of claim 1, wherein the pins of the second connecting terminal are connected to the pads by a laser welding process.

8. The electronic device of claim 1, wherein the function module comprises at least one of a power module, a camera module, a fingerprint module, a display module, a sensor module, and a voice module.

9. The electronic device of claim 1, wherein when the number of the pins on the second connecting terminal of the flexible printed circuit board is larger than 40, the pads in the corresponding preset area are arranged in a plurality of rows.

* * * * *